(12) United States Patent
Pinkos et al.

(10) Patent No.: US 11,134,584 B2
(45) Date of Patent: Sep. 28, 2021

(54) WIRELESS DEVICE CHARGER WITH COOLING DEVICE

(71) Applicant: Aptiv Technologies Limited, St. Michael (BB)

(72) Inventors: Andrew F. Pinkos, Clarkston, MI (US); John Mecca, Oakland Township, MI (US)

(73) Assignee: APTIV TECHNOLOGIES LIMITED

( * ) Notice: Subject to any disclaimer, the term of this patent is extended or adjusted under 35 U.S.C. 154(b) by 0 days.

(21) Appl. No.: 16/917,058

(22) Filed: Jun. 30, 2020

(65) Prior Publication Data
US 2020/0352050 A1 Nov. 5, 2020

Related U.S. Application Data

(63) Continuation of application No. 16/241,142, filed on Jan. 7, 2019, now abandoned.

(60) Provisional application No. 62/615,193, filed on Jan. 9, 2018.

(51) Int. Cl.
| | |
|---|---|
| *H05K 7/20* | (2006.01) |
| *H01F 27/08* | (2006.01) |
| *H01F 38/14* | (2006.01) |
| *H02J 7/02* | (2016.01) |
| *H02J 50/80* | (2016.01) |
| *B60L 53/122* | (2019.01) |

(52) U.S. Cl.
CPC ........ *H05K 7/20145* (2013.01); *B60L 53/122* (2019.02); *H01F 27/085* (2013.01); *H01F 38/14* (2013.01); *H02J 7/025* (2013.01); *H02J 50/80* (2016.02); *H05K 7/20209* (2013.01); *H05K 7/20845* (2013.01)

(58) Field of Classification Search
CPC .......... H05K 7/20136; H05K 7/20145; H05K 7/20209; H05K 7/20845; H02J 50/10; H02J 50/80; H02J 7/025; B60L 53/122; H01F 27/085; H01F 38/14; H04B 5/0037
See application file for complete search history.

(56) References Cited

U.S. PATENT DOCUMENTS

| | | | | |
|---|---|---|---|---|
| 9,445,524 | B2 * | 9/2016 | Lofy | ................. H05K 7/20145 |
| 9,451,723 | B2 * | 9/2016 | Lofy | ....................... H02J 7/025 |
| 9,861,006 | B2 * | 1/2018 | Lofy | ................. H05K 7/20145 |
| 10,219,407 | B2 * | 2/2019 | Lofy | ................. H05K 7/20136 |

(Continued)

FOREIGN PATENT DOCUMENTS

| | | | |
|---|---|---|---|
| KR | 101727465 | B1 * | 4/2017 |
| KR | 101879656 | B1 * | 7/2018 |

(Continued)

*Primary Examiner* — Robert J Hoffberg
(74) *Attorney, Agent, or Firm* — Billion & Armitage

(57) ABSTRACT

A wireless device charger is configured to produce an alternating magnetic field, thereby inducing an alternating electrical current within a capture coil of a personal electronic device proximate to the wireless device charger. The wireless device charger includes a source coil having a ferrite element configured to generate the alternating magnetic field, a housing formed of a thermally conductive material in thermal communication with the ferrite element, and an air movement device configured to produce a turbulent air flow across a surface of the housing flowing from an air inlet to an air outlet, thereby reducing a housing temperature.

10 Claims, 24 Drawing Sheets

(56) References Cited

U.S. PATENT DOCUMENTS

| | | | | |
|---|---|---|---|---|
| 10,270,276 | B2* | 4/2019 | Kim | H02J 50/005 |
| 10,439,423 | B2* | 10/2019 | Lachnitt | H04B 5/0037 |
| 10,455,728 | B2* | 10/2019 | Lofy | H02J 7/0044 |
| 10,782,752 | B2* | 9/2020 | Koo | G06F 1/203 |
| 10,814,807 | B2* | 10/2020 | Lee | H02J 50/60 |
| 10,833,526 | B2* | 11/2020 | Thiel | B60R 11/02 |
| 2016/0072337 | A1* | 3/2016 | Chang | H04B 5/0037 |
| | | | | 320/108 |
| 2019/0115781 | A1* | 4/2019 | Feng | H02J 7/0044 |
| 2020/0161897 | A1* | 5/2020 | Dudar | H04B 5/0037 |
| 2021/0050741 | A1* | 2/2021 | Pinkos | B60R 16/03 |
| 2021/0167632 | A1* | 6/2021 | Burdenski | H02J 50/005 |

FOREIGN PATENT DOCUMENTS

| | | | | | |
|---|---|---|---|---|---|
| KR | 20180078789 | A | * | 7/2018 | |
| KR | 101995805 | B1 | * | 7/2019 | |
| KR | 20200007467 | A | * | 1/2020 | |
| KR | 102182328 | B1 | * | 11/2020 | |
| KR | 102202882 | B1 | * | 1/2021 | |
| KR | 20210007721 | A | * | 1/2021 | |
| WO | WO-2019136691 | A1 | * | 7/2019 | H05K 7/20 |

* cited by examiner

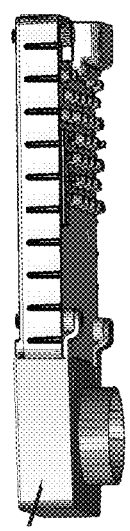
Fig. 3
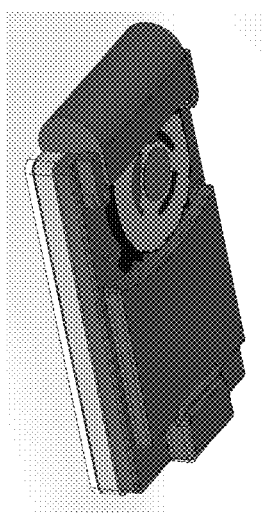
Fig. 6
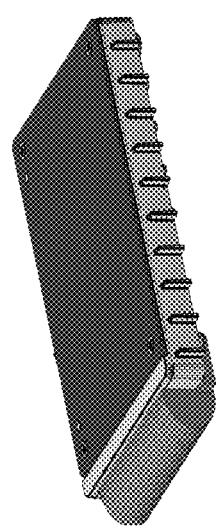
Fig. 2
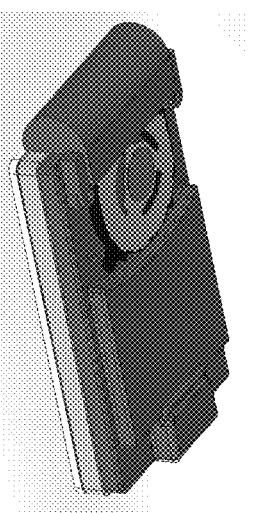
Fig. 5
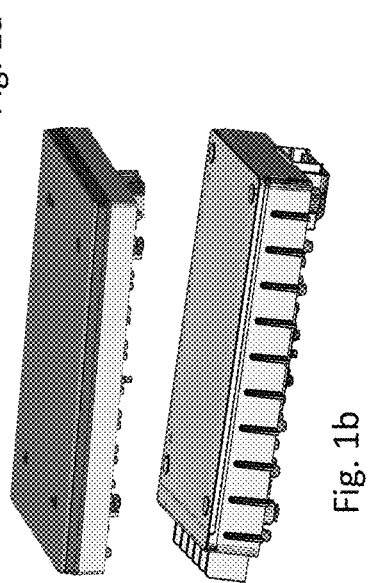
Fig. 1a
Fig. 1b
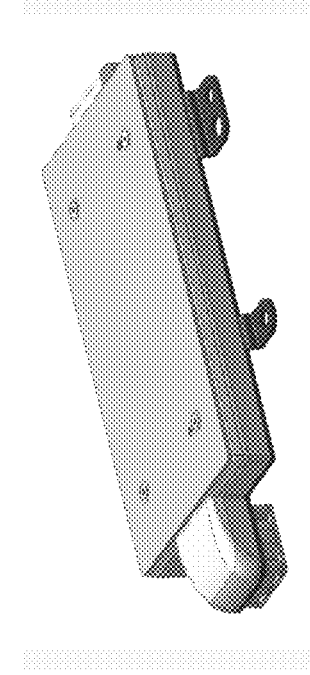
Fig. 4

| ITEM | MATERIAL | MFG PROCESS | MASS (g) | DERIVATION METHOD |
|---|---|---|---|---|
| PC COVER | LEXAN BB35 | INJECTION | 3.5 | CALCULATED |
| SCREW (4) | 10B21 SAE J403 | | 2.5 | CALCULATED |
| NFC PCBA | FR4 | | 15 | CALCULATED |
| LITZ COIL ASM W/ FERRITE | COPPER WIRE/ OVERCOAT PA-V (OSP18) FERRITE - GOTREND MSPGW100569-S0-V1R0 | | 50 | CALCULATED |
| THERMAL PAD | SILICONE MARIAN PN P024458 (SAINTYOO SY/GP120) | | 1.6 | CALCULATED |
| SPACER | 10% G.F. PC ABS | INJECTION | 4 | CALCULATED |
| HOUSING | 380.0-F DIE CASTING ALLOY | DIE CAST | 53.5 | CALCULATED |
| PCBA-CONTROL | FR4 | | 43 | CALCULATED |
| BOTTOM COVER | 10% G.F. PC ABS – OR – 380.0-F DIE CASTING ALLOY | INJECTION – OR – DIE CAST | 19.5 | CALCULATED |
| | | Total | 192.6 | |

Fig. 8

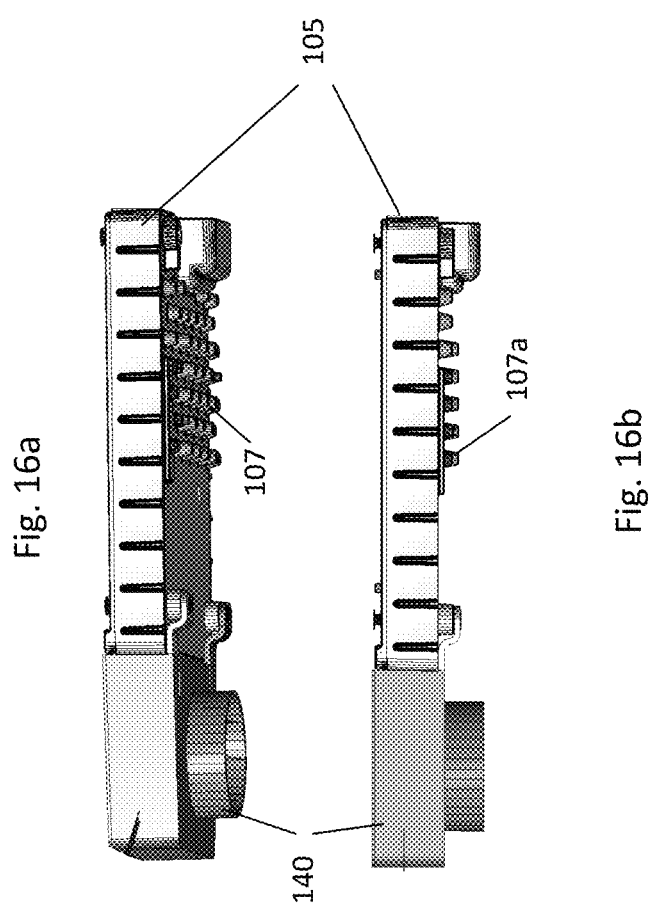

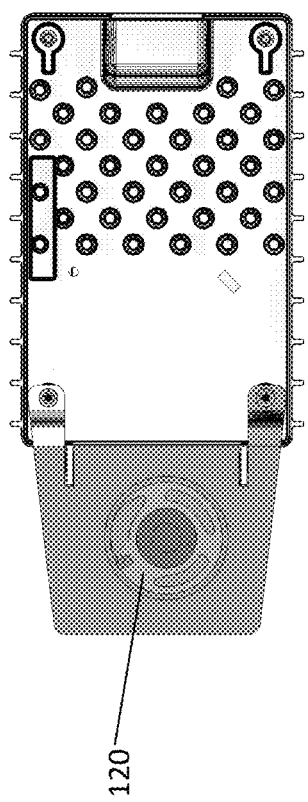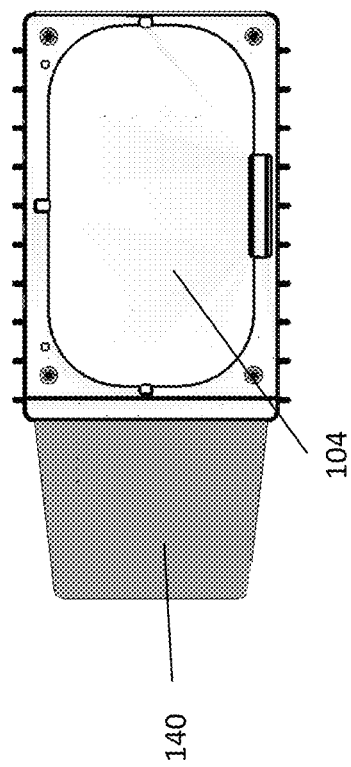

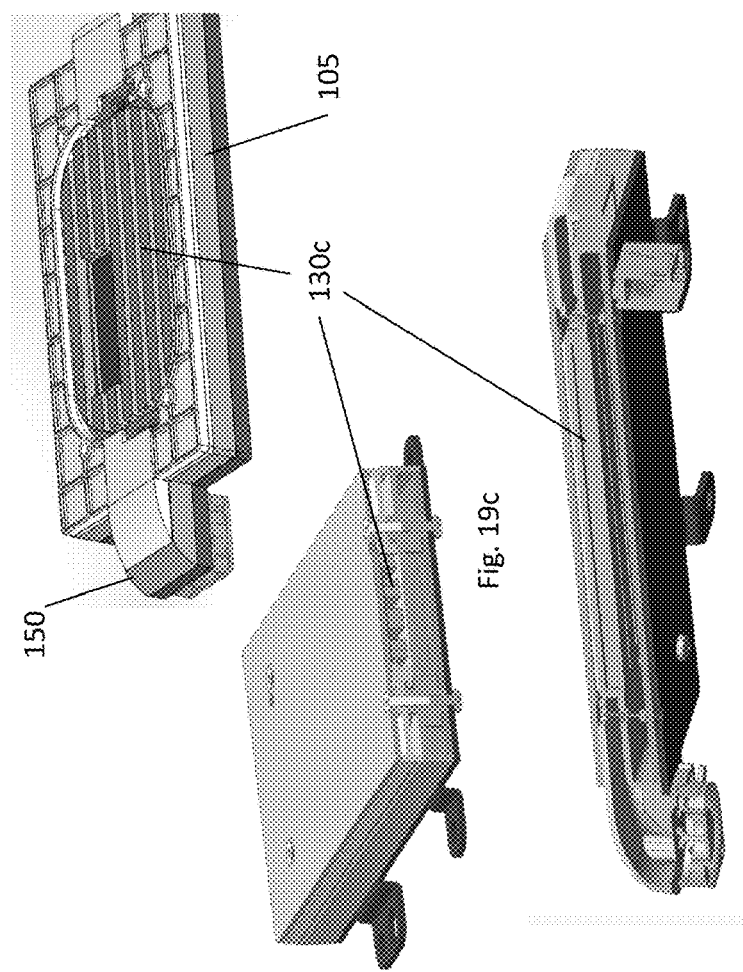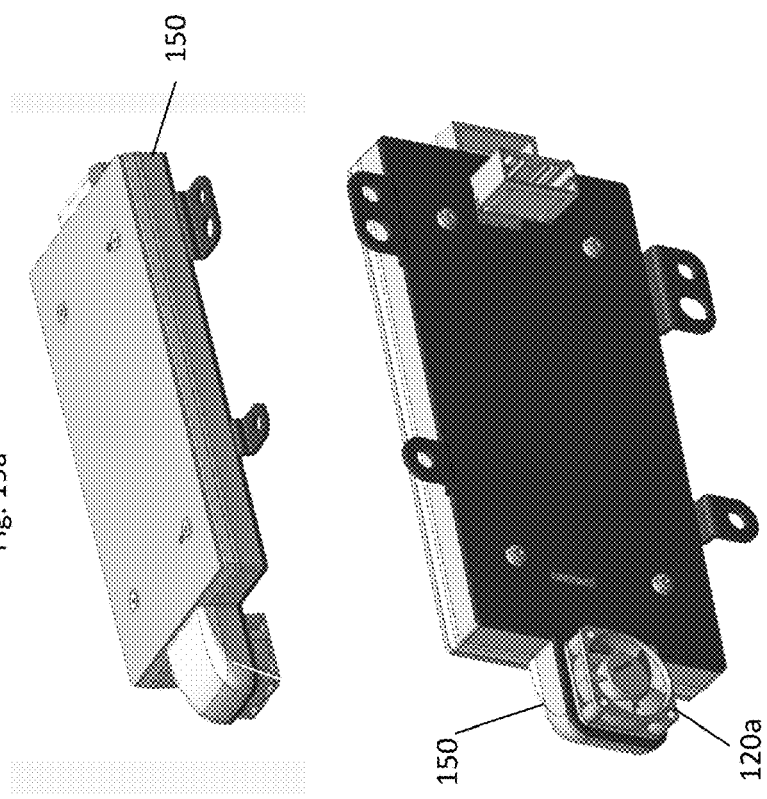

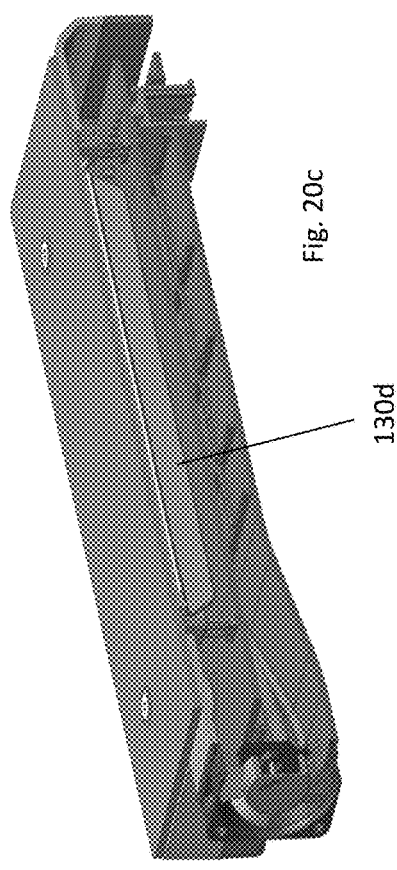
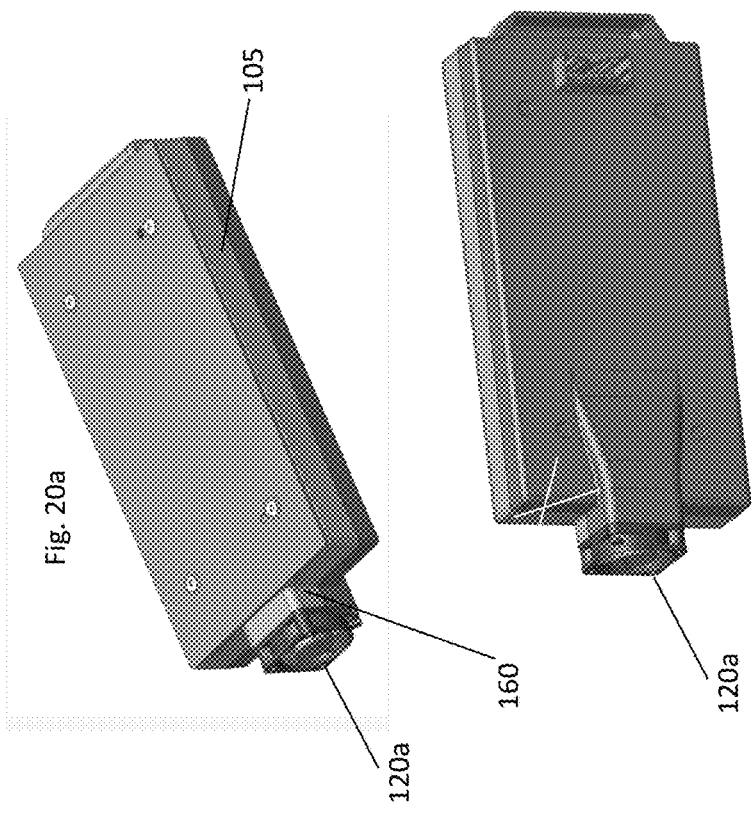

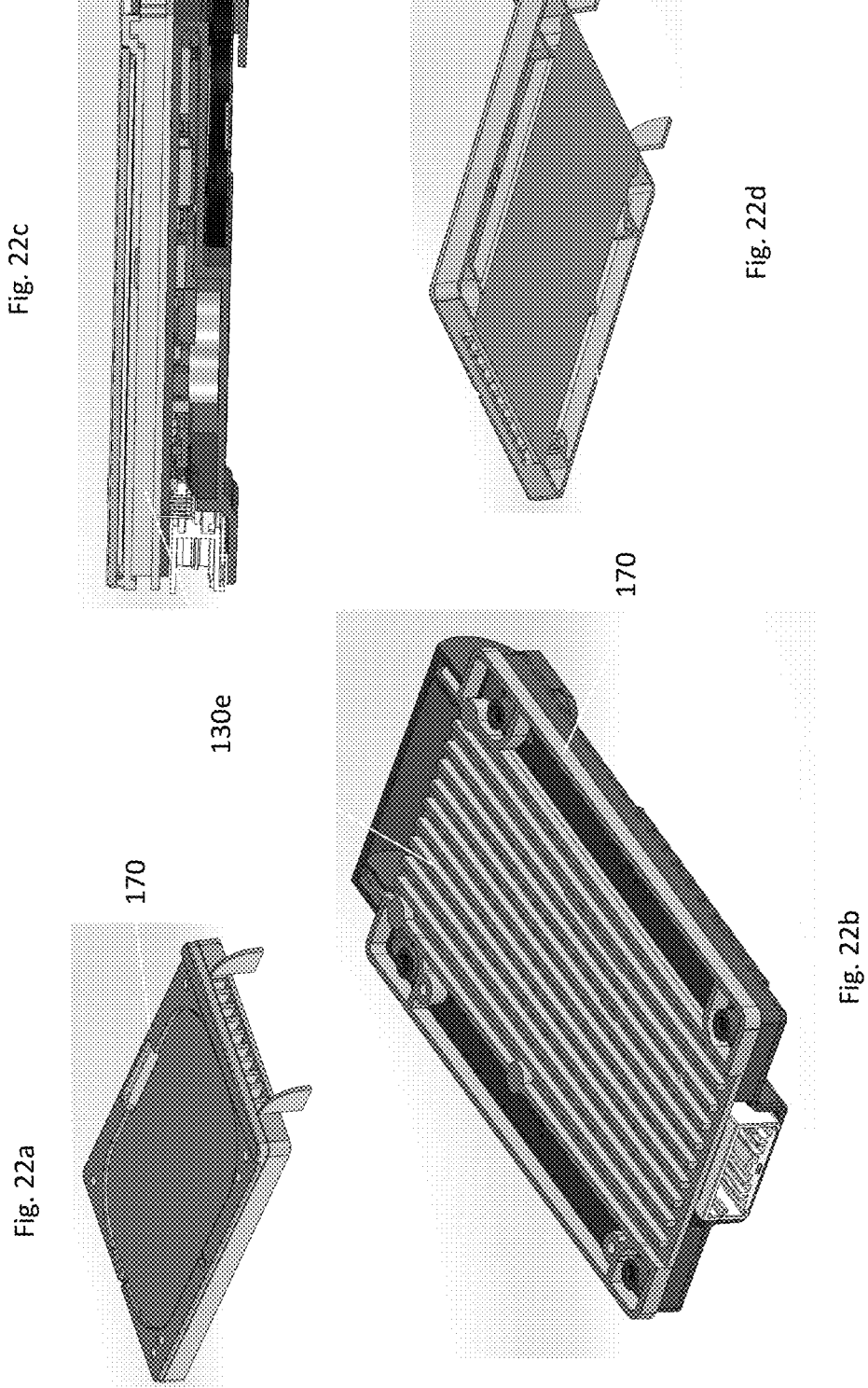

WIRELESS DEVICE CHARGER WITH COOLING DEVICE

CROSS-REFERENCE TO RELATED APPLICATION

This is a continuation application and claims the benefit under 35 U.S.C. § 120 of U.S. patent application Ser. No. 16/241,142, filed Jan. 7, 2019 which claimed the benefit under 35 U.S.C. § 119(e) of U.S. Provisional Patent Application No. 62/615,193 filed on Jan. 9, 2018, the entire disclosure of which is hereby incorporated by reference.

TECHNICAL FIELD OF THE INVENTION

The invention generally relates to wireless device chargers and more particularly to a wireless device charger having a cooling device to remove heat from the assembly.

BRIEF DESCRIPTION OF THE SEVERAL VIEWS OF THE DRAWING

The present invention will now be described, by way of example with reference to the accompanying drawings, in which:

FIGS. 1a and 1b are perspective views of a wireless device charger (WDC) in accordance with a first embodiment of the invention;

FIG. 2 is a perspective view of a WDC in accordance with a second embodiment of the invention;

FIG. 3 is a perspective view of a WDC in accordance with a third embodiment of the invention;

FIG. 4 is a perspective view of a WDC in accordance with a fourth embodiment of the invention;

FIG. 5 is a perspective view of a WDC in accordance with a fifth embodiment of the invention;

FIG. 6 is a perspective view of a WDC in accordance with a sixth embodiment of the invention;

FIG. 8 is a chart of the materials used to form the components of the WDC of FIG. 1 in accordance with the first embodiment of the invention;

FIG. 16a is perspective of the WDC of FIG. 3 in accordance with the third embodiment of the invention;

FIG. 16b is a side view of the WDC of FIG. 3 in accordance with the third embodiment of the invention;

FIG. 17a is a bottom view of the WDC of FIG. 3 in accordance with the third embodiment of the invention;

FIG. 17b is a top view of the WDC of FIG. 3 in accordance with the third embodiment of the invention;

FIG. 19a is a top perspective view of the WDC of FIG. 4 in accordance with the fourth embodiment of the invention;

FIG. 19b is a bottom perspective view of the WDC of FIG. 4 in accordance with the fourth embodiment of the invention;

FIG. 19c is a perspective end view of the WDC of FIG. 4 in accordance with the fourth embodiment of the invention;

FIG. 19d is a top perspective view of the WDC of FIG. 4 with a top cover removed in accordance with the fourth embodiment of the invention;

FIG. 19e is side cut away view of the WDC of FIG. 4 in accordance with the fourth embodiment of the invention;

FIG. 20a is a top perspective view of the WDC of FIG. 5 in accordance with the fifth embodiment of the invention;

FIG. 20b is a bottom perspective view of the WDC of FIG. 5 in accordance with the fifth embodiment of the invention;

FIG. 20c is side cut away view of the WDC of FIG. 5 in accordance with the fifth embodiment of the invention;

FIG. 22a bottom perspective view of the WDC of FIG. 6 in accordance with the sixth embodiment of the invention;

FIG. 22b is a top perspective view of the WDC of FIG. 6 with the top cover removed in accordance with the sixth embodiment of the invention;

FIG. 22c is a side cut away view of the WDC of FIG. 6 in accordance with the sixth embodiment of the invention;

FIG. 22d is a bottom perspective view of the WDC of FIG. 6 in accordance with the sixth embodiment of the invention;

DETAILED DESCRIPTION OF THE INVENTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Lithium-ion batteries used within today's personal electronic devices (PEDs) have established limits to protect the PED battery from being exposed to excessive temperatures. Japan Electronics and Information Technology Industries Association (JEITA) has established guidelines for improving battery charging safety by setting this upper temperature threshold at 60° C. Typical PED charging temperatures range between −10° C. to +60° C.

The Wireless Power Consortium (WPC) has released a Medium Power (MP) specification with received powers up to 60 watts (W), and have an Enhanced Power (EP) subset for receivers to accept up to 15 W, which will match USB fast charging capability for a wired connecting to the charger. This EP subset is beneficial to automotive battery chargers so wireless fast charging can match plugged in capability of a USB cable. Original equipment manufacturers (OEMs) of motor vehicles are now demanding this capability. This invention will improve PED charging performance by removing or redistributing heat within a wireless device charger (WDC), thereby extending the amount of time for PED charging operation and providing a higher state of charge (SOC) over a shorter time period by eliminating charging interruption due to exceeding the temperature threshold. This is critical to PED charging especially if PED has an excessively low SOC.

Volumetric space for electronic components, such as a WDC, is limited in an automotive environment. The WDC is configured to move air within an enclosed space and/or move air from the heating, ventilation, and air conditioning (HVAC) duct through the WDC and, more particularly, across the heat generating components of the WDC. This invention, in various embodiments, will provide air movement within the tight vehicle packaging space that will allow the PED surface temperature to remain below a threshold where PEDs will typically shutdown battery charging to reduce temperatures within the PED.

FIGS. 1-6 illustrate multiple embodiments of the WDC with different electrical connection configurations.

Figure 7:
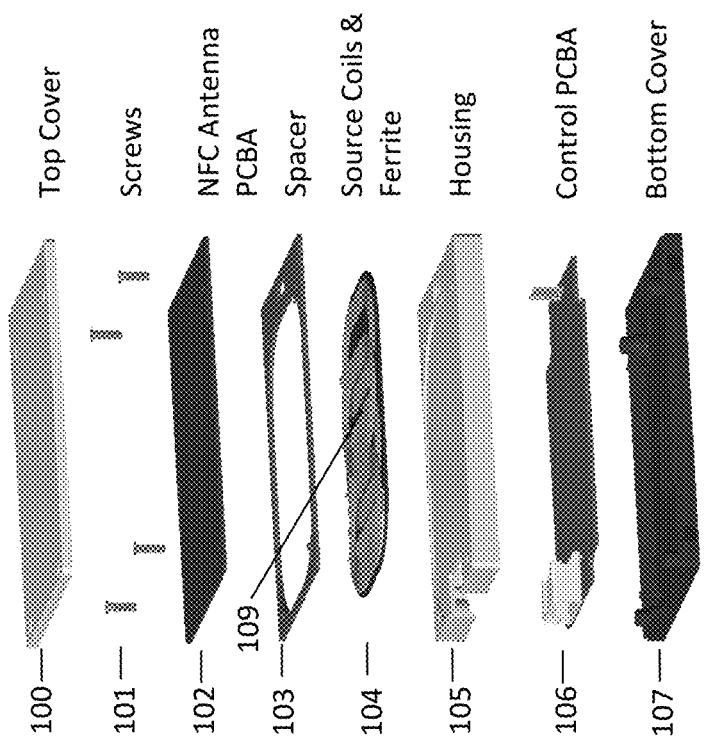
FIG. 7 is an exploded view of the WDC of FIG. 1 in accordance with the first embodiment of the invention.
Figure 9:
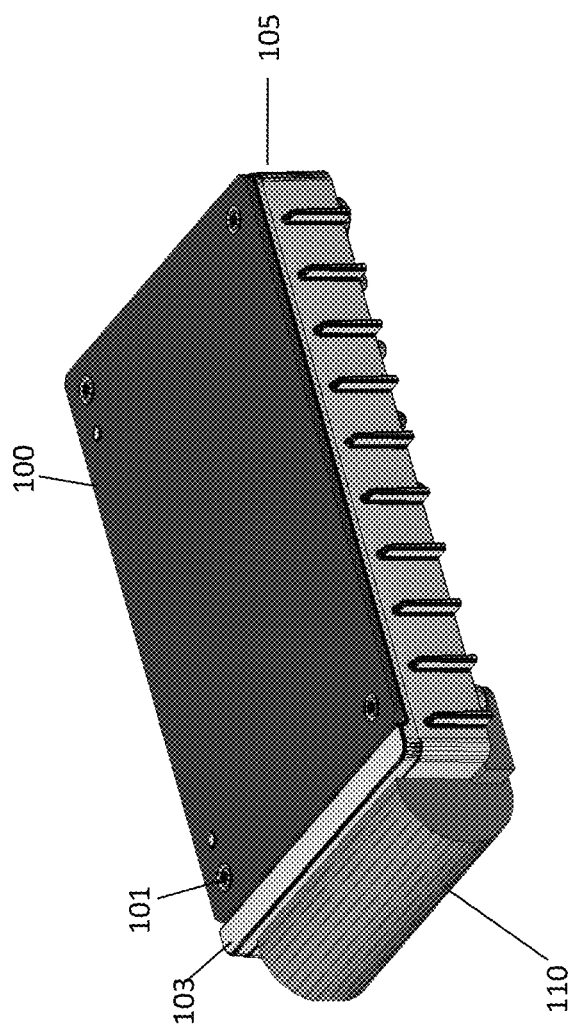
FIG. 9 is an alternative perspective view of the WDC of FIG. 2 in accordance with the second embodiment of the invention.
Figure 10:
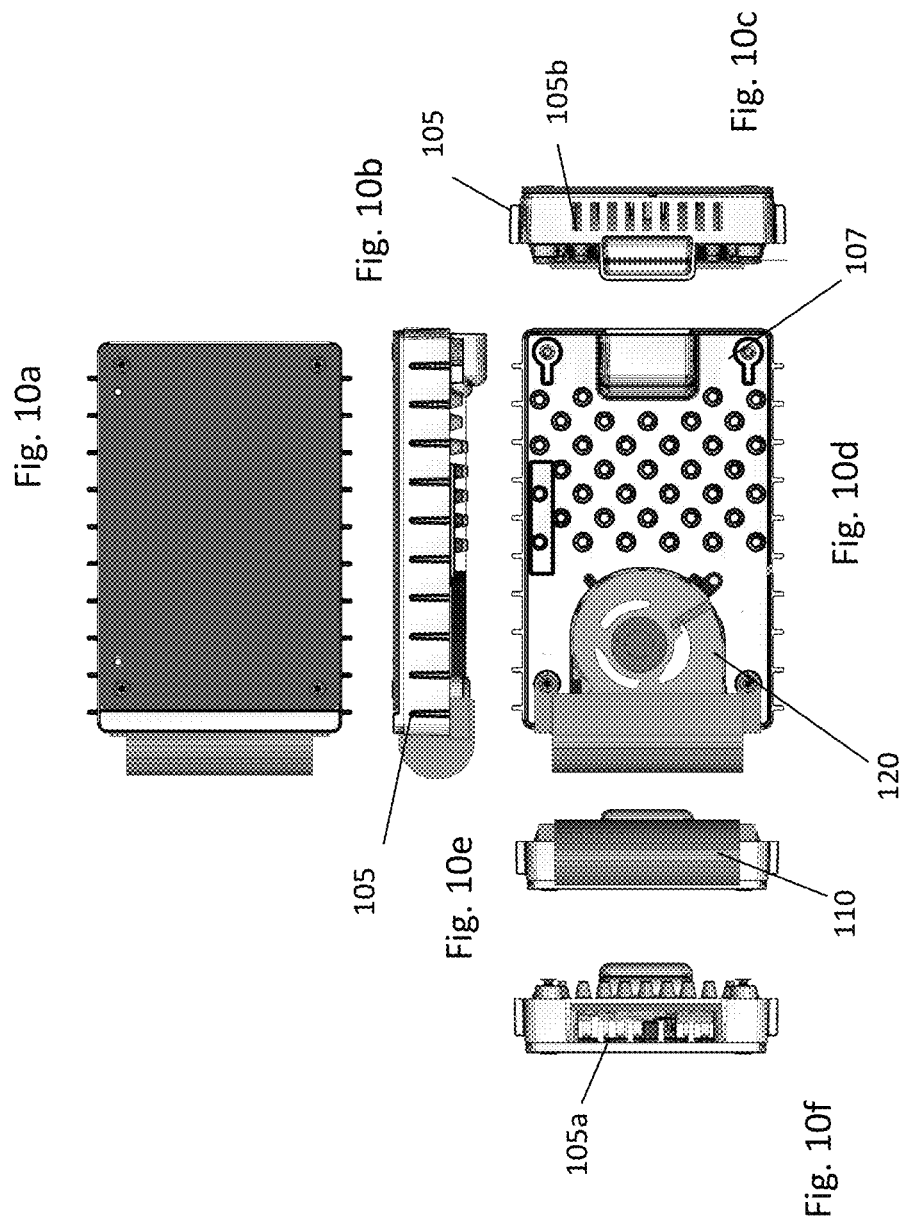
FIG. 10a is top view of the WDC of FIG. 2 in accordance with the second embodiment of the invention.
FIG. 10b is a side view of the WDC of FIG. 2 in accordance with the second embodiment of the invention.
FIG. 10c is a right end view of the WDC of FIG. 2 in accordance with the second embodiment of the invention.
FIG. 10d is a bottom view of the WDC of FIG. 2 in accordance with the second embodiment of the invention.
FIG. 10e is a left end view of the WDC of FIG. 2 in accordance with the second embodiment of the invention.
FIG. 10f is a left end view of the WDC of FIG. 2 with the air duct removed in accordance with the second embodiment of the invention.
Figure 11:
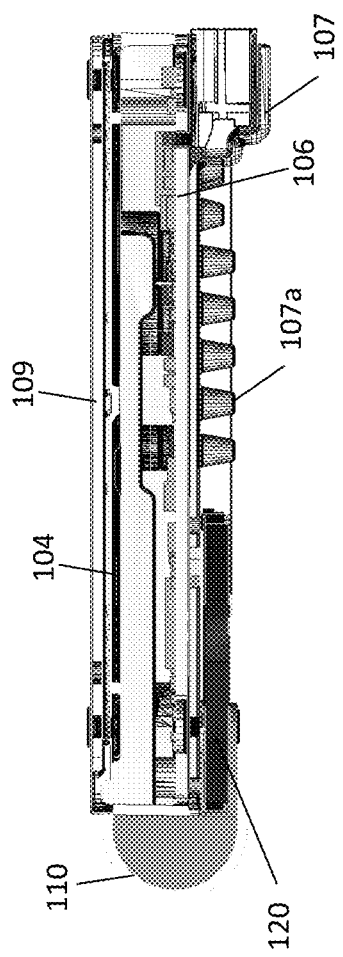
FIG. 11 is a cross section side view of the WDC of FIG. 2 in accordance with the second embodiment of the invention.
Figure 13:
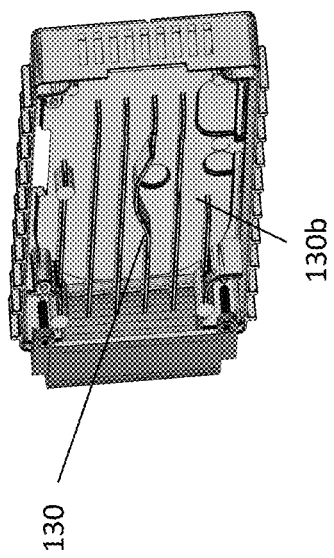
FIG. 13 is a cross section top view of the WDC of FIG. 2 showing a surface enhancement in accordance with the second embodiment of the invention.
Figure 12:
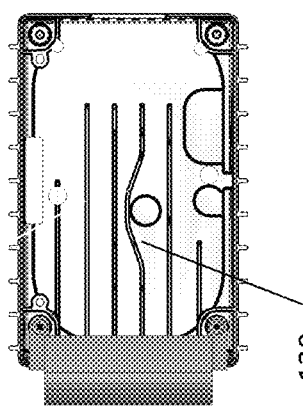
FIG. 12 is a cross section top view of the WDC of FIG. 2 showing a nonlinear fin in accordance with the second embodiment of the invention.

FIG. 7 illustrates a first embodiment of the WDC having a top cover 100 and screws 101 configured to secure the top cover 100 to a bottom cover 107. The WDC also includes a near field communication (NFC) printed circuit board assembly (PCBA) that is configured to communicate with a portable electronic device (PED) (not shown) that is charged by the WDC. The source coils 104 having a ferrite element 109 that are used to generate an alternating magnetic field are in direct contact with a housing 105 that is formed of a thermally conductive material, such as a cast aluminum. The housing 105 serves as a heat sink to draw heat away from the source coils 104 and the ferrite element 109. The source coils 104 and the ferrite element 109 are surrounded by a dielectric spacer 103. The WDC further contains a control PCBA 106 that includes electronic components that generate the alternating current supplied to the source coils 104 as well as controller circuitry configured to control the charging process and communicate with the PED via the NFC PCBA 102. Examples of materials used to form the various components of the WDC are shown in FIG. 8. Variations of these components may be used in any of the various embodiments of the WDC.

Figure 14:
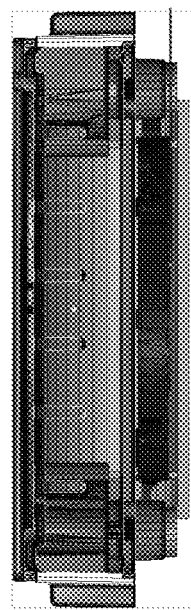
FIG. 14 is an end view of an air inlet of the WDC of FIG. 2 in accordance with the second embodiment of the invention.
Figure 15:
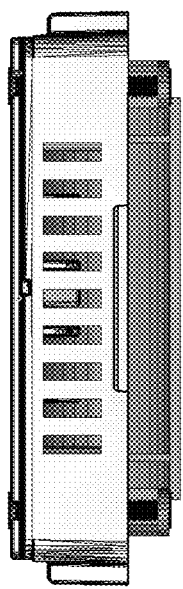
FIG. 15 is an end view of an air exhaust of the WDC of FIG. 2 in accordance with the second embodiment of the invention.
Figure 18C:
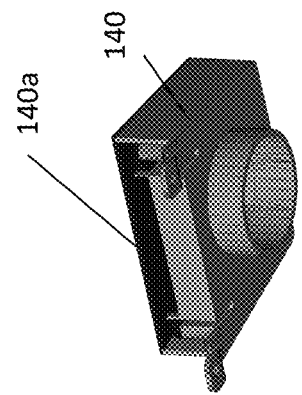
FIG. 18c is a perspective view of a blower and air duct of the WDC of FIG. 3 in accordance with the third embodiment of the invention.
Figure 18B:
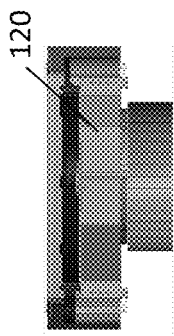
FIG. 18b is an end view of a blower and air duct of the WDC of FIG. 3 in accordance with the third embodiment of the invention.
Figure 18A:
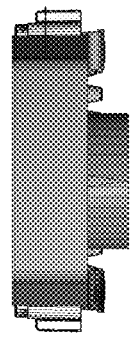
FIG. 18a is a side view of a blower and air duct of the WDC of FIG. 3 in accordance with the third embodiment of the invention.
Figure 21C:
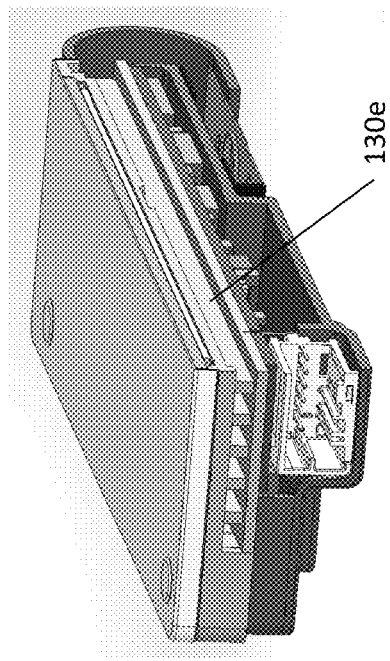
FIG. 21c is a side cut away view of the WDC of FIG. 6 in accordance with the sixth embodiment of the invention.
Figure 21D:
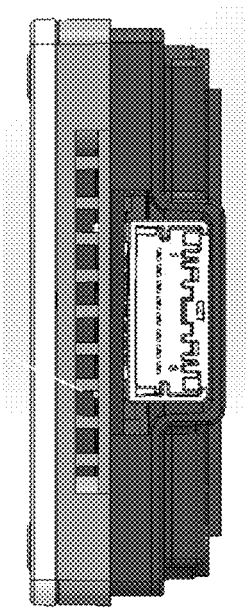
FIG. 21d is an end view of the WDC of FIG. 6 in accordance with the sixth embodiment of the invention.
Figure 21A:
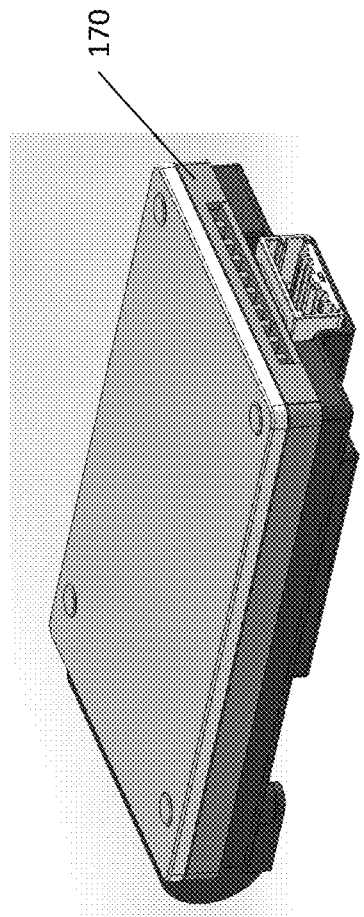
FIG. 21a is a top perspective view of the WDC of FIG. 6 in accordance with the sixth embodiment of the invention.
Figure 21B:
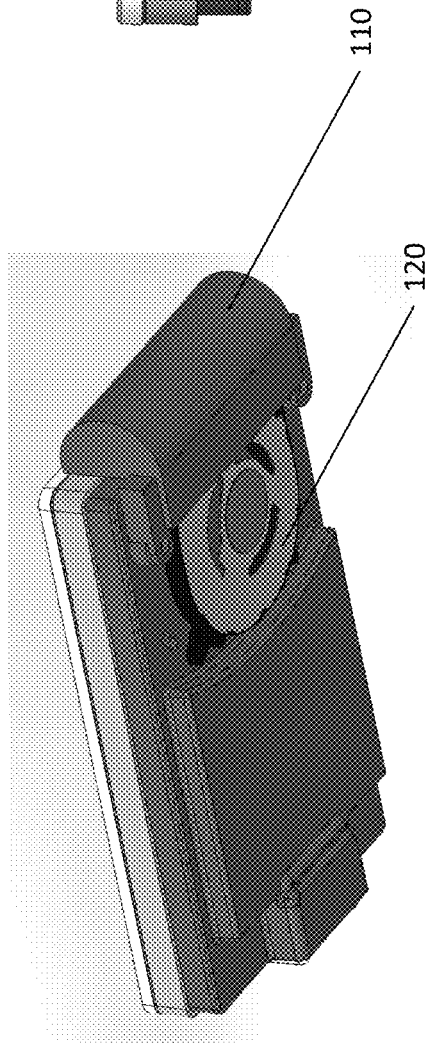
FIG. 21b is a bottom perspective view of the WDC of FIG. 6 in accordance with the sixth embodiment of the invention.
Figure 23:
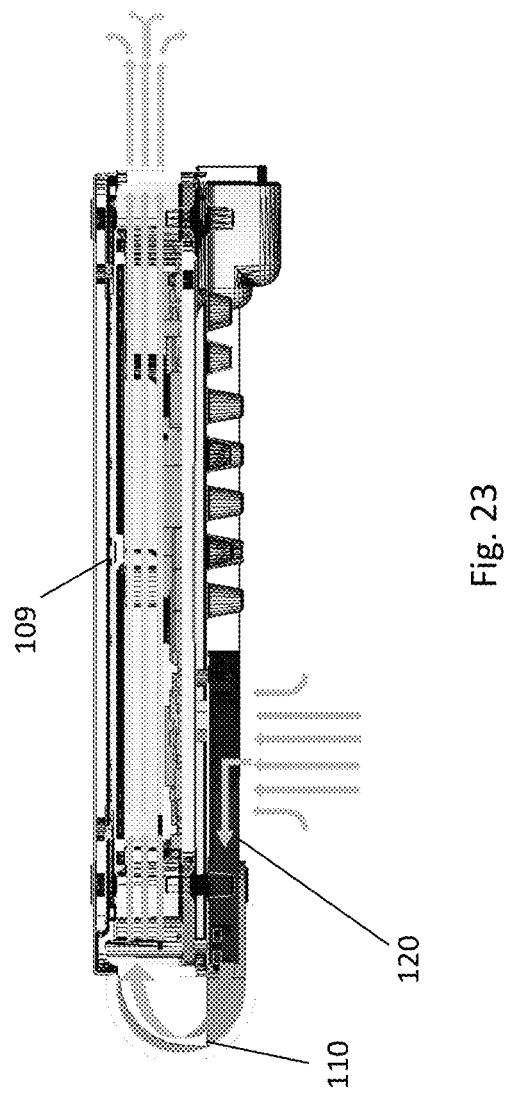
FIG. 23 is cross section view of the WDC of FIG. 2 showing air flow through the WDC in accordance with the second embodiment of the invention.
Figure 24:
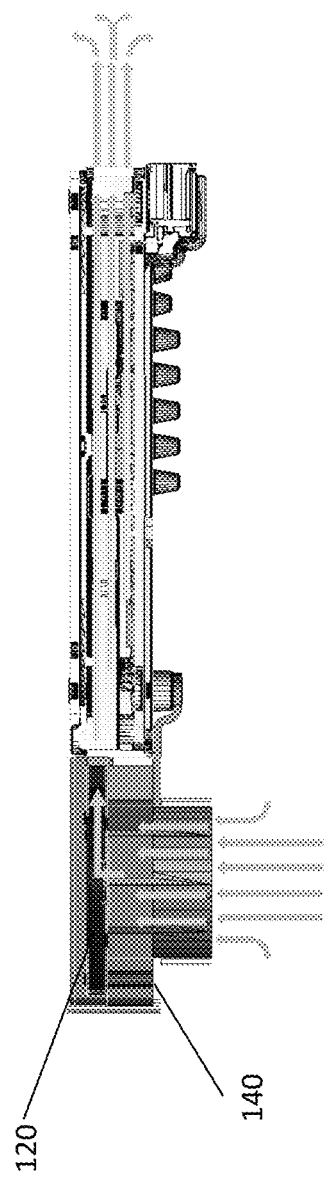
FIG. 24 is cross section view of the WDC of FIG. 3 showing air flow through the WDC in accordance with the third embodiment of the invention.
Figure 25:
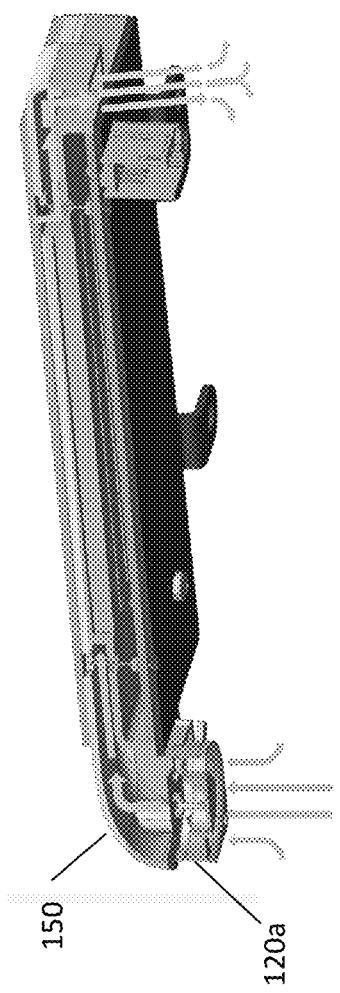
FIG. 25 is cross section view of the WDC of FIG. 4 showing air flow through the WDC in accordance with the fourth embodiment of the invention.
Figure 26:
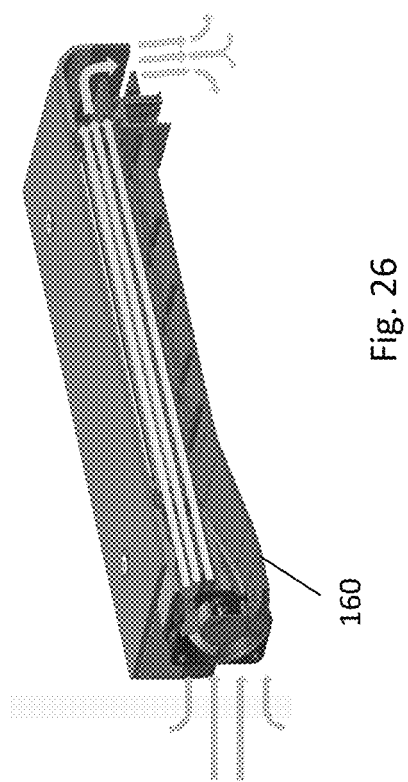
FIG. 26 is cross section view of the WDC of FIG. 5 showing air flow through the WDC in accordance with the fifth embodiment of the invention.
Figure 27:
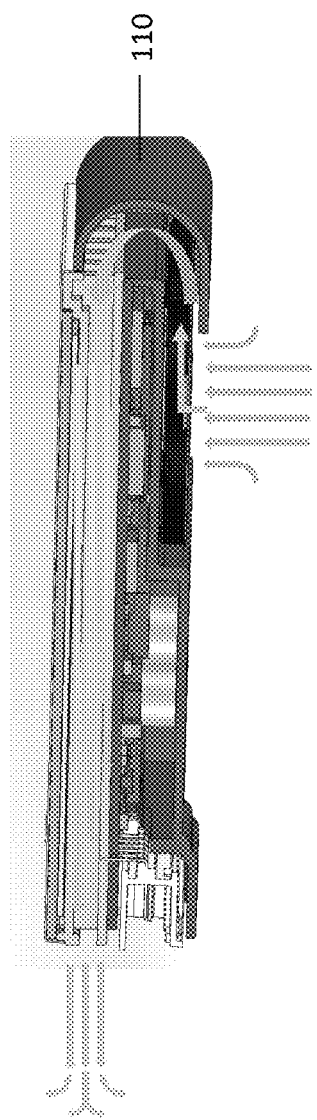
FIG. 27 is cross section view of the WDC of FIG. 6 showing air flow through the WDC in accordance with the sixth embodiment of the invention.
Figure 28:
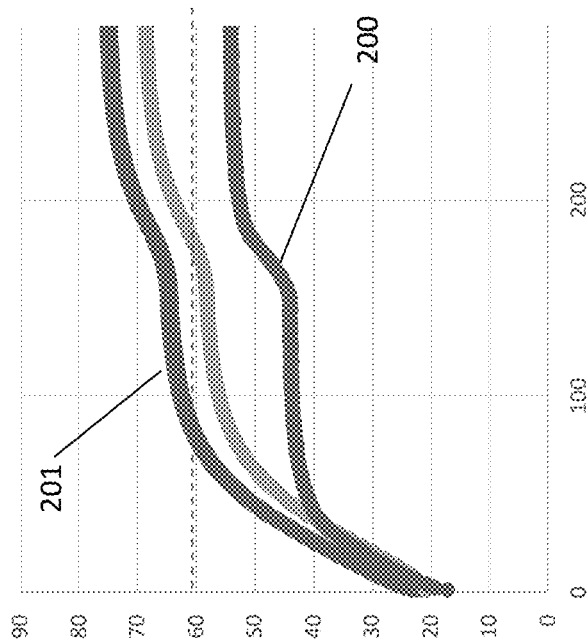
FIG. 28 is chart showing temperature of various components of the WDC over an operating time of 300 second in accordance with the prior art.
Figure 29:
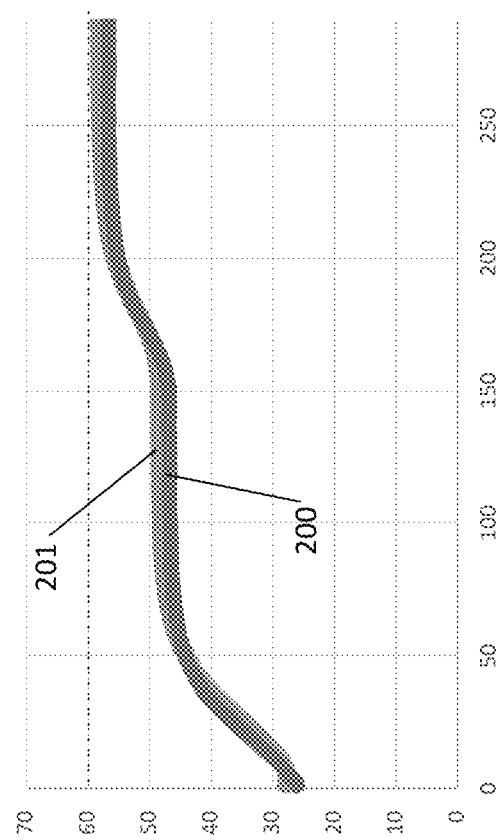
FIG. 29 is chart showing temperature of various components of the WDC over an operating time of 300 second in accordance with an embodiment of the invention.
Figure 30:
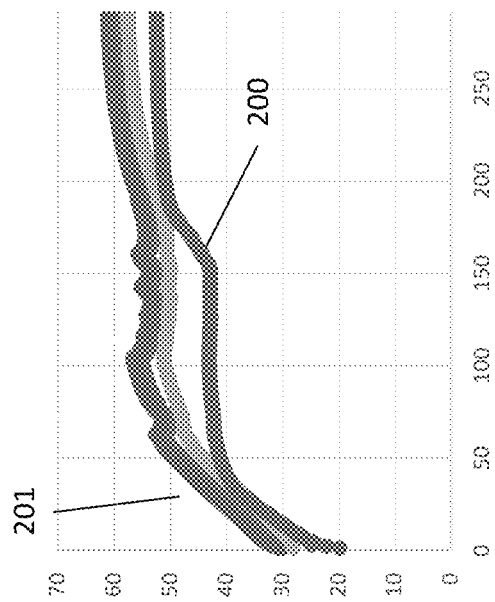
FIG. 30 is chart showing temperature of various components of the personal electronic device (PED) over an operating time of 300 second in accordance with the prior art.
Figure 31:
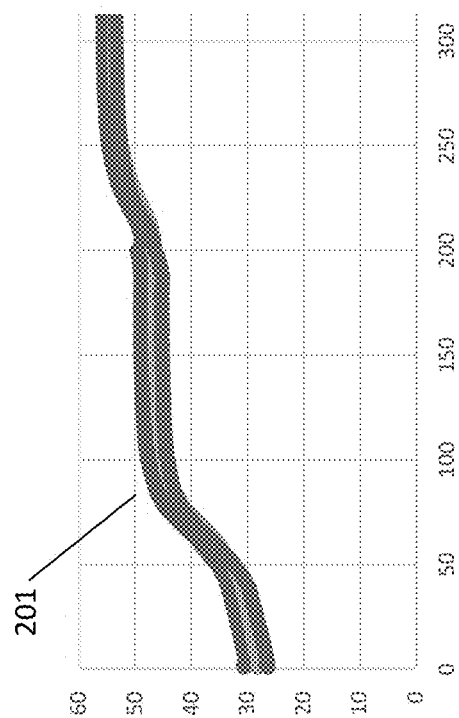
FIG. 31 is chart showing temperature of various components of the PED over an operating time of 300 second in accordance with an embodiment of the invention.

FIGS. 9-15 illustrate a second embodiment of the WDC that further includes an air movement device, such as a fan or blower 120 and an air duct that is configured to redirect the air from the blower 120 through the WDC from the air inlet 105a shown in FIG. 14 to the air exhaust 105b shown in FIG. 15. Packaging of the WDC is intended to optimize blower 120 placement and the radius of the air duct 110 to route air flow with least air resistance into the WDC internal chamber in direct contact with the housing 105 surfaces. The radius of the air duct 110 is selected to minimize the amount of height added to the WDC to accommodate the air duct 110. The air duct 110 is created such that the radius is identical to half of the complete thickness of the WDC and the blower 120 thus reducing the air pressure drop through the air duct 110 by reducing air turbulence. Applying air pressure at the air inlet 105a, air flow will traverse from the air inlet 105a to the air exhaust 105b. Air flow will increase heat transfer from the housing 105 to the air within the WDC. Directed air flow along the longitudinal axis of the WDC creates the largest surface area and, without subscribing to any particular theory of operation, the heat transfer from the housing 105 is directly proportional to the length of the surface of the housing 105.

The second embodiment includes a plurality of posts 107a extending from an external surface of the bottom cover 107. Without subscribing to any particular theory of operation, these posts 107a draw additional heat from the WDC by conduction.

This second embodiment increases surface area of the housing by defining a geometry of extending contiguous metal fins 130 to the underside of the housing 105 along the line of forced air flow. The heat generating components, the source coils 104, and the ferrite element 109, are arranged opposite to this surface and transfer heat to the surfaces exposed to direct air flow.

The laminar air flow across the housing surface is disturbed to create airflow turbulence that impinges upon the housing 105 to increase heat transfer from the metal housing to the air flow through the WDC. One example of creating turbulent air flow is accomplished by adding at least one fin 130a that have a non-symmetric surface, e.g. fins 130a that extend in a nonlinear or longitudinal zig-zag pattern from inlet end to exhaust end as shown in FIG. 12a. Another method of creating turbulent air flow is by roughening the fin surface 130b, e.g. by sandblasting the housing 105 surface, also shown in FIG. 12b.

FIGS. 16a-18c illustrate a third embodiment of the WDC incorporating a separate blower housing 140 containing the blower 120.

FIGS. 19a-19e illustrate a fourth embodiment of the WDC incorporating a separate blower housing extension 150 containing the blower 120a and a plurality of fins 130c extending from the housing 105.

FIGS. 20a-20c illustrate a fifth embodiment of the WDC having a housing 160 and blower 120a placement that is in-line to route air flow into the WDC internal chamber in direct contact with heat source surfaces with reduced air flow resistance and a plurality of fins 130d extending from the housing 105. The design minimizes the height of the WDC for packaging.

The enclosed air flow space can be sealed from the electronics of the WDC for highest degree of protection per the International Organization for Standardization (ISO) Standard 20653:2013. FIGS. 21a-21d and 22a-22d illustrate a sixth embodiment of the WDC having a housing 170, a blower 120a capable of meeting IP code IP5K2 for enclosures of electrical equipment as defined by ISO 20653:2013, which describes protection from dust and liquid intrusion. This embodiment will allow for providing IP5K2 level of sealing while still maintaining airflow to specific heat generating components. This embodiment also includes a plurality of fins 130e extending from the housing 105.

FIGS. 23 through 27 illustrate the air flow through the various embodiments of the WDC.

Blower speed may be modulated through by measuring the temperature of the WDC components or PED components and adjusting the blower speed for optimum cooling by airflow. Temperatures regulated with applied airflow provide improved PED charging levels and extend charging times even with high ambient temperatures, e.g. exceeding 40° C., within the vehicle.

The blower is preferably oriented for optimum noise reduction to operator. Any rotating components, such as the blower 120 may generate audible noise at normal operating speeds. The location and orientation of the blower in the various embodiments is selected to minimize a direct noise path from the blower to the top surface of the WDC. This will limit blower noise transfer to operator.

As mentioned above, this invention optimizes the PED charging surface temperatures by removing or redistributing heat within the module and thereby lowering PED charging surface temperatures. The result of lowering module surface temperatures is that it will extend PED charging times, thereby enhancing user experience by providing more reliable charging and reduced charging times. The automotive packaging environment is extremely tight even when trying to package a WDC. HVAC ducts that typically are located underneath or around the battery charger, if located within the center console area, contribute to higher WDC temperatures which limit air movement below the PED charging surface.

Accordingly, a wireless device charger (WDC) is provided. The WDC includes a fan, blower, or other air movement device to cool the components within the WDC to reduce heating of a personal electronic device (PED) being charged by the WDC, thereby reducing the chances of a thermal shutdown of the PED that would increase charging time of the battery in the PED.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'One or more' includes a function being performed by one element, a function being performed by more than one element, e.g., in a distributed fashion, several functions being performed by one element, several functions being performed by several elements, or any combination of the above.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

While terms of ordinance or orientation may be used herein, these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. A wireless device charger, comprising:
a source coil configured to generate an alternating magnetic field;
electronic components configured to supply an alternating current to the source coil;
a housing defining an internal chamber which is sealed from the electronic components; and an air movement device configured to produce an air flow from an air inlet through an air duct and the internal chamber to an air outlet, thereby reducing a temperature of the housing, wherein the air inlet is substantially perpendicular to the air outlet, wherein the air duct is configured to redirect the air flow from the air inlet to the air outlet, wherein the air duct is characterized as having a semicircular shape, and wherein a radius of the semicircular shape is substantially equal to a half of a thickness of the wireless device charger.

2. The wireless device charger according to claim 1, wherein the internal chamber is located and arranged between the source coil and the electronic components.

3. The wireless device charger according to claim 1, wherein the source coil includes a ferrite element which is in intimate contact with the housing.

4. The wireless device charger according to claim 3, wherein the internal chamber is sealed from the source coil which includes the ferrite element.

5. The wireless device charger according to claim 4, wherein the housing is formed of an aluminum material.

6. The wireless device charger according to claim 1, wherein a surface of the housing defines a plurality of fins extending into the internal chamber.

7. The wireless device charger according to claim 6, wherein the plurality of fins is located and arranged between the source coil and the electronic components.

8. The wireless device charger according to claim 1, wherein the wireless device charger further comprises controller circuitry configured to modulate the air flow from the air movement device based on a personal electronic device temperature.

9. The wireless device charger according to claim 1, further comprising a near field communication printed circuit board assembly that is configured to communicate with a portable electronic device.

10. The wireless device charger according to claim 9, further comprising controller circuitry configured to control generation of the alternating current and communicate with the portable electronic device via the near field communication printed circuit board assembly.

* * * * *